(12) United States Patent
Wang et al.

(10) Patent No.: US 7,528,407 B2
(45) Date of Patent: May 5, 2009

(54) THIN FILM TRANSISTOR ARRAY SUBSTRATE AND FABRICATING METHOD THEREOF

(75) Inventors: Yeong-Feng Wang, Hsinchu (TW); Chih-Jui Pan, Hsinchu (TW); Liang-Bin Yu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 264 days.

(21) Appl. No.: 11/674,157

(22) Filed: Feb. 13, 2007

(65) Prior Publication Data
US 2008/0116516 A1 May 22, 2008

(30) Foreign Application Priority Data
Nov. 16, 2006 (TW) .............................. 95142394 A

(51) Int. Cl.
*H01L 29/04* (2006.01)
(52) U.S. Cl. .......................................... 257/59; 257/72
(58) Field of Classification Search .................. 257/59, 257/72
See application file for complete search history.

(56) References Cited

U.S. PATENT DOCUMENTS

| 5,021,355 | A | 6/1991 | Dhong et al. |
| 5,364,810 | A | 11/1994 | Kosa et al. |
| 6,033,957 | A | 3/2000 | Burns, Jr. et al. |
| 6,077,745 | A | 6/2000 | Burns, Jr. et al. |
| 6,624,033 | B2 | 9/2003 | Noble |
| 2002/0127811 | A1 | 9/2002 | Noble |
| 2004/0063286 | A1 | 4/2004 | Kim et al. |
| 2008/0111132 | A1* | 5/2008 | Wang .......................... 257/59 |

* cited by examiner

*Primary Examiner*—Jack Chen
(74) *Attorney, Agent, or Firm*—Jianq Chyun IP Office

(57) ABSTRACT

A TFT array substrate is provided. The TFT array substrate includes a substrate, a patterned first metallic layer, a patterned semiconductor layer, a patterned transparent conductive layer, a patterned dielectric layer, and a patterned second metallic layer. Elements of each TFT of the TFT array substrate are arranged vertically, so that the TFT array substrate has relatively small fabrication area and is operable with a high conducting current. Further, the storage capacitance can be enhanced by enclosing or sandwiching the transparent electrodes with the common lines and the second metallic layer, or alternatively by enclosing or sandwiching the second metallic layer with the common lines and the transparent electrodes.

6 Claims, 14 Drawing Sheets

THIN FILM TRANSISTOR ARRAY SUBSTRATE AND FABRICATING METHOD THEREOF

CROSS-REFERENCE TO RELATED APPLICATION

This application claims the priority benefit of Taiwan application serial no. 95142394, filed Nov. 16, 2006. All disclosure of the Taiwan application is incorporated herein by reference.

BACKGROUND OF THE INVENTION

1. Field of the Invention

The present invention relates to a thin film transistor (TFT) array substrate and a fabricating method thereof, in particular, to a TFT array substrate operable with a high conducting current and a fabricating method thereof.

2. Description of Related Art

TFTs have been widely employed for controlling circuit signals. They are also employed in the art of flat displays to control the inputting/outputting operation of signals, and facilitating with storage capacitors to upgrade passive driving to active driving, thus improving displaying quality thereof.

In designing pixel electrodes, when considering how to efficiently utilize characteristics of elements, signals are also to be avoided from coupling to each other. Specifically, displays used for viewing active programs having higher refreshing frequencies require not only used elements having better discharging features, but also signals being designed not to likely coupled to each other, so that better displaying quality can be obtained.

FIG. 1 is a schematic diagram illustrating a capacitor circuit of a conventional TFT liquid crystal display (LCD). FIG. 2 illustrates voltage waveforms of the conventional TFT LCD of FIG. 1.

Referring to FIGS. 1 and 2, voltage variation of the TFT, (mainly the variation of the voltage 10 of a scan line) often causes a feed through voltage via a parasitical capacitor (mainly a gate/drain parasitical capacitor Cgd), and therefore causes a display electrode voltage 20 downwardly deviated a value of ΔV. In an ideal consideration, a common voltage 30 is downwardly adjusted ΔV to another common voltage 40 to compensate the voltage difference caused by the feed through voltage, or a storage capacitance Cs is to be increased to the correct the ΔV caused by coupling to each other of the signals.

However, unfortunately, increasing the storage capacitor exhibits its advantage only if the discharging feature of the TFTs is also improved. Otherwise, it will be hard to charge the storage capacitor up to a desired level in a certain time, so that gray levels thereof won't be displayed correctly.

SUMMARY OF THE INVENTION

Accordingly, the present invention is directed to a TFT array substrate, having smaller fabricating area.

The present invention is also directed to a TFT array substrate, operable with a high conducting current.

The present invention is still also directed to a fabricating method of a TFT array substrate, capable of increasing storage capacitance thereof.

The present invention is further directed to provide a TFT array substrate, capable of decreasing pixel flashing caused by signals coupling to each other.

According to an embodiment of the present invention, a fabricating method of a TFT array substrate is proposed. According to the fabricating method, a substrate is firstly provided. Then, a patterned first metallic layer is formed on the substrate, to form a plurality of common lines, a plurality of scan lines, and a plurality of source patterns. Each two adjacent scan lines are orthogonal to two corresponding source patterns adjacent to each other, so as to define a pixel area on the substrate. The common lines are configured passing through their corresponding pixel areas, and parallel with the scan lines. A protrusion is extruded from each of the source patterns at a position adjacent to its corresponding scan line, acting as a source electrode. Then, a patterned semiconductor layer is formed over the substrate to form a first semiconductor pattern on the source electrode in each pixel area, and a second semiconductor pattern on the common line in each pixel area, respectively. Each second semiconductor pattern has a first opening exposing the corresponding common line. Then, a patterned transparent conductive layer is formed over the substrate, so as to form a pixel electrode in each pixel area. Each pixel electrode covers a first semiconductor patter and a second semiconductor pattern corresponding thereto. Each pixel electrode has a second opening corresponding to the first opening. Then, a patterned dielectric layer is formed over the substrate, to form a first dielectric pattern over each common line, and a second dielectric pattern at an intersection of an extending direction of each source pattern and its corresponding scan line. Each first dielectric pattern has a third opening corresponding to the second opening, and each second dielectric pattern extends to cover its corresponding source electrode, and the first semiconductor pattern and the pixel electrode formed over the source electrode. Thereafter, a patterned second metallic layer is formed over the substrate, to form a plurality of data lines, a plurality of gate electrodes, and a plurality of metal electrodes. Each data line is disposed on a corresponding source pattern along the direction the source pattern extending. Each gate electrode is disposed on the second dielectric pattern over the corresponding source electrode, extending to connect to the corresponding scan line. Each metal electrode is disposed over the first dielectric pattern in the corresponding pixel area, electrically connected to its corresponding common line via the third opening, the second opening and the first opening.

According to an embodiment of the present invention, the fabricating method further includes, when forming the semiconductor layer, forming ohmic contact layers at a top side and a bottom side of the semiconductor layer respectively.

According to an embodiment of the present invention, a method of forming the ohmic contact layers includes ion implantation.

According to an embodiment of the present invention, the step of forming the semiconductor layer comprising forming a third semiconductor pattern at the intersection of the extending direction of each source pattern with the corresponding scan line and the corresponding common line, and the corresponding subsequently formed second dielectric pattern covering the third semiconductor pattern.

The present invention provides a TFT array substrate. The TFT array substrate includes a substrate, a patterned first metallic layer, a patterned semiconductor layer, a patterned transparent layer, a patterned dielectric layer, and a patterned second metallic layer. The patterned first metallic layer is disposed on the substrate. The patterned first metallic layer includes a plurality of common lines, a plurality of scan lines, and a plurality of source patterns. Each two adjacent scan lines are orthogonal to two corresponding source patterns adjacent to each other, so as to define a pixel area on the substrate. The common lines are configured passing through their corresponding pixel areas, and parallel with the scan lines. A protrusion is extruded from each of the source patterns at a position adjacent to its corresponding scan line, acting as a source electrode. The patterned semiconductor layer is disposed on the patterned first metallic layer and the substrate, including a plurality of first semiconductor patterns and a plurality of second semiconductor patterns. The first semiconductor patterns are correspondingly configured on the source electrodes in the pixel areas, and the second semiconductor patterns are correspondingly configured on the common lines in the pixel areas, respectively. Each second semiconductor pattern has a first opening exposing the common line. The patterned transparent conductive layer is disposed on the patterned semiconductor layer and the substrate, defining a pixel electrode in each pixel area. Each pixel electrode covers a first semiconductor patter and a second semiconductor pattern corresponding thereto. Each pixel electrode has a second opening corresponding to the first opening. The patterned dielectric layer is disposed over the substrate, including a plurality of first dielectric patterns, and a plurality of second dielectric patterns. Each first dielectric pattern is disposed over the corresponding common line, and has a third opening corresponding to the second opening. Each second dielectric pattern is disposed at an intersection of an extending direction of each source pattern and its corresponding scan line and extends to cover its corresponding source electrode, and the first semiconductor pattern and the pixel electrode formed over the source electrode. The patterned second metallic layer is disposed over the substrate, including a plurality of data lines, a plurality of gate electrodes, and a plurality of metallic electrodes. Each data line is disposed on the corresponding source pattern along the direction the source pattern extending. Each gate electrode is disposed on the second dielectric pattern over the corresponding source electrode, extending to connect to the corresponding scan line. Each metal electrode is disposed on the first dielectric pattern in the corresponding pixel area, electrically connected to its corresponding common line via the third opening, the second opening and the first opening.

According to an embodiment of the present invention, there are ohmic contact layers formed on a top side and a bottom side of the semiconductor layer, respectively.

According to an embodiment of the present invention, the material of the ohmic contact layers includes doped amorphous silicon.

According to an embodiment of the present invention, the transparent conductive layer is made of a material including indium tin oxide (ITO) or indium zinc oxide (IZO).

According to an embodiment of the present invention, the first metallic layer is conformed by stacking a plurality of metallic layers.

According to an embodiment of the present invention, the patterned semiconductor layer further includes a plurality of third semiconductor patterns, disposed at the intersection of the extending direction of each source pattern with the corresponding scan line and the corresponding common line, each third semiconductor pattern being covered by the corresponding second dielectric pattern.

The present invention also provides a fabricating method of a TFT array substrate. A substrate is firstly provided, on which a first metallic layer, a semiconductor layer, and a second metallic layer are sequentially formed. Then, the second metallic layer, the semiconductor layer, and the first metallic layer are patterned, in which the first metallic layer are defined as a plurality of common lines, a plurality of scan lines, and a plurality of source patterns. Each two adjacent scan lines are orthogonal to two corresponding source patterns adjacent to each other, so as to define a pixel area on the substrate. The common lines are configured to pass through their corresponding pixel areas, and parallel with the scan lines. A protrusion is extruded from each of the source patterns at a position adjacent to its corresponding scan line, acting as a source electrode. Simultaneously, the second metallic layer and semiconductor layer in each pixel area are defined as a first pattern stack disposed on a corresponding source electrode, a second pattern stack disposed on a corresponding common line, and a third pattern stack disposed at an intersection of an extending direction of each source pattern with its corresponding scan line and its corresponding common line. The second pattern stack has a first opening exposing the common line. Then a patterned dielectric layer is formed over the substrate, to form a second opening corresponding to and over the first opening in each pixel area, a third opening over the first pattern stack and exposing a part of the first pattern stack in each pixel area, a plurality of fourth openings over both sides of the second pattern stack and exposing a part of the second pattern stack in each pixel area, a fifth opening over a side of the scan line adjacent to the source electrode and exposing a part of the scan line in each pixel area, and a plurality of sixth openings configured respectively over both sides of the source pattern and both sides of the third pattern stack, the sixth openings exposing a part of the source pattern and a part of the third pattern stack, respectively. Then, a patterned transparent conductive layer is formed over the substrate, to form two pixel electrodes at both sides of the common line in each pixel area. The pixel electrodes are electrically connected to the second pattern stack via the fourth openings, in which one of the pixel electrodes is electrically connected to the first pattern stack via the third opening. A first transparent electrode is defined over the second pattern stack in each pixel area. The first transparent electrode is electrically connected to the common line via the second opening and the first opening. A gate electrode is defined over the source electrode in each pixel area. The gate electrode is electrically connected to the scan line via the fifth opening. A second transparent electrode is defined at the intersection of the extending direction of each source pattern and its corresponding scan line and its corresponding common line. The second transparent electrodes are electrically connected to the source pattern and the third pattern stack via the sixth opening. Then a patterned third metallic layer is formed over the substrate, to form a plurality of data lines, each of which is disposed over the source pattern along the extending direction of the source pattern, and electrically connected to the second transparent electrode corresponding thereto.

The present invention is further directed to a TFT array substrate. The TFT array substrate includes a substrate, a patterned first metallic layer, a patterned stack layer, a patterned dielectric layer, a patterned transparent conductive layer, and a patterned third metallic layer. The patterned first metallic layer is disposed on the substrate, including a plurality of common lines, a plurality of scan lines, and a plurality of source patterns. Each two adjacent scan lines are orthogonal to the two corresponding source patterns adjacent to each other, so as to define a pixel area on the substrate. The common lines are configured passing through their corresponding pixel areas and parallel with the scan lines. A protrusion is extruded from each of the source patterns at a position adjacent to its corresponding scan line, acting as a source electrode. The patterned stack layer is composed of a semiconductor layer, a second metallic layer disposed in sequence from bottom to top on the patterned first metallic layer and the substrate. The patterned stack layer includes a plurality of first stack patterns, a plurality of second stack patterns, and a plurality of third stack patterns. The first stack patterns are correspondingly disposed on a source electrode in each pixel area. The second stack patterns are disposed on the common lines. Each second stack pattern has an opening exposing the corresponding common line. Each third stack pattern is disposed at an intersection of an extending direction of each source pattern with the corresponding scan line and the corresponding common line. The patterned dielectric layer is disposed over the substrate, including a plurality of second openings, a plurality of third openings, a plurality of fourth openings, a plurality of fifth openings, and a plurality of sixth openings. The second openings are configured over and corresponding to the first openings in each pixel area. The third openings are configured over the first pattern stacks and exposing a part of the first patter stacks in each pixel area respectively. The fourth openings are configured over both sides of the second patter stacks, and exposing a part of the second patter stacks in each pixel area respectively. The fifth openings are configured over a side of the scan line adjacent to the source electrode and exposing a part of the scan lines in each pixel respectively. The sixth openings are configured over both sides of the source pattern and both sides of the third pattern stacks and exposing a part of the source patterns and a part of the third pattern stacks in each pixel area respectively. The patterned transparent conductive layer is disposed on the patterned dielectric layer and the substrate, to form two pixel electrodes at both sides of the common line in each pixel area, respectively. The pixel electrodes are electrically connected to the second pattern stack, one of the pixel electrodes are electrically connected to the first pattern stack via the third opening. There is a first transparent electrode configured over the second patter stack in each pixel area. The first transparent conductive electrode is electrically connected to the common lines via the first openings and the second openings. Gate electrodes are configured over the source electrode in each pixel area respectively. The gate electrodes are electrically connected to the scan lines via the fifth openings. A second transparent electrode is configured at the intersection of the extending direction of each source pattern with the corresponding common lines and the corresponding scan lines. The second transparent electrodes are electrically connected to the source patterns, and the third pattern stacks. The patterned third metallic layer is disposed over the substrate, including a plurality of data lines, each of which is configured along a direction of the corresponding source pattern, and over the corresponding source pattern, and electrically connected to a corresponding second transparent electrode.

Accordingly, elements of each TFT in the TFT array substrate according to the present invention are arranged vertically, so that the TFT array substrate has relatively small fabrication area and is operable with a high conducting current.

Moreover, in the TFT array substrate according to the present invention, the storage capacitance can be enhanced by enclosing or sandwiching the transparent electrodes with the common lines and the second metallic layer, or alternatively by enclosing or sandwiching the second metallic layer with the common lines and the transparent electrodes. In such a way, pixel flashing caused by those coupled signals can be reduced, thus promoting displaying quality thereof.

Furthermore, according to an embodiment of the present invention, ohmic contact layers are configured at both of the top side and the bottom side of the semiconductor layer, thus short channel effect can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
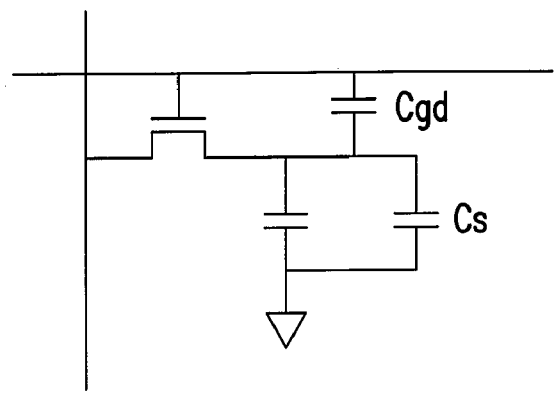
FIG. 1 is a schematic diagram illustrating a capacitor circuit of a conventional TFT LCD.
Figure 2:
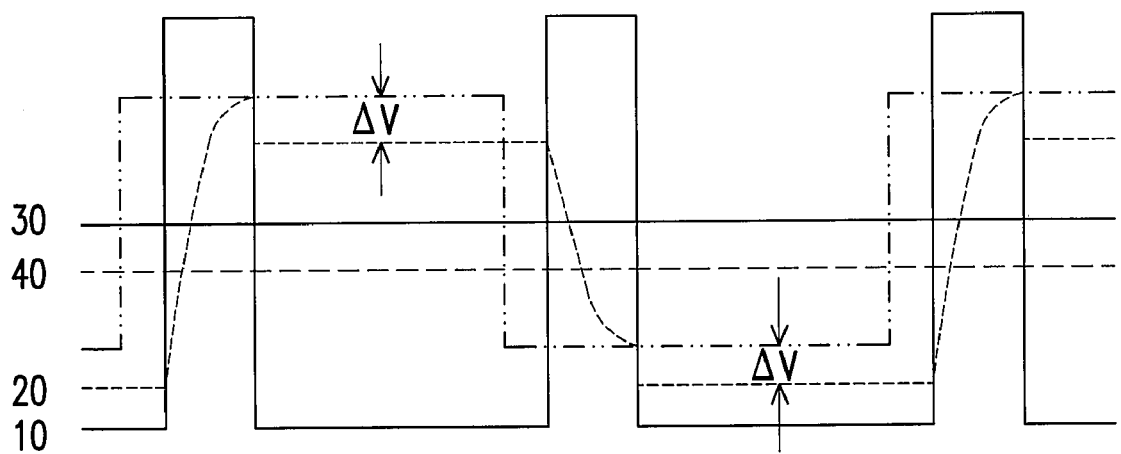
FIG. 2 illustrates voltage waveforms of the conventional TFT LCD of FIG. 1.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3E are cross-sectional views illustrating a fabricating process of a TFT array substrate according to an embodiment of the present invention. FIGS. 4A through 4E are cross-sectional views along lines A-A' and B-B' of FIGS. 3A through 3E illustrating the fabricating process flow of FIGS. 3A through 3E.

Figure 3A:
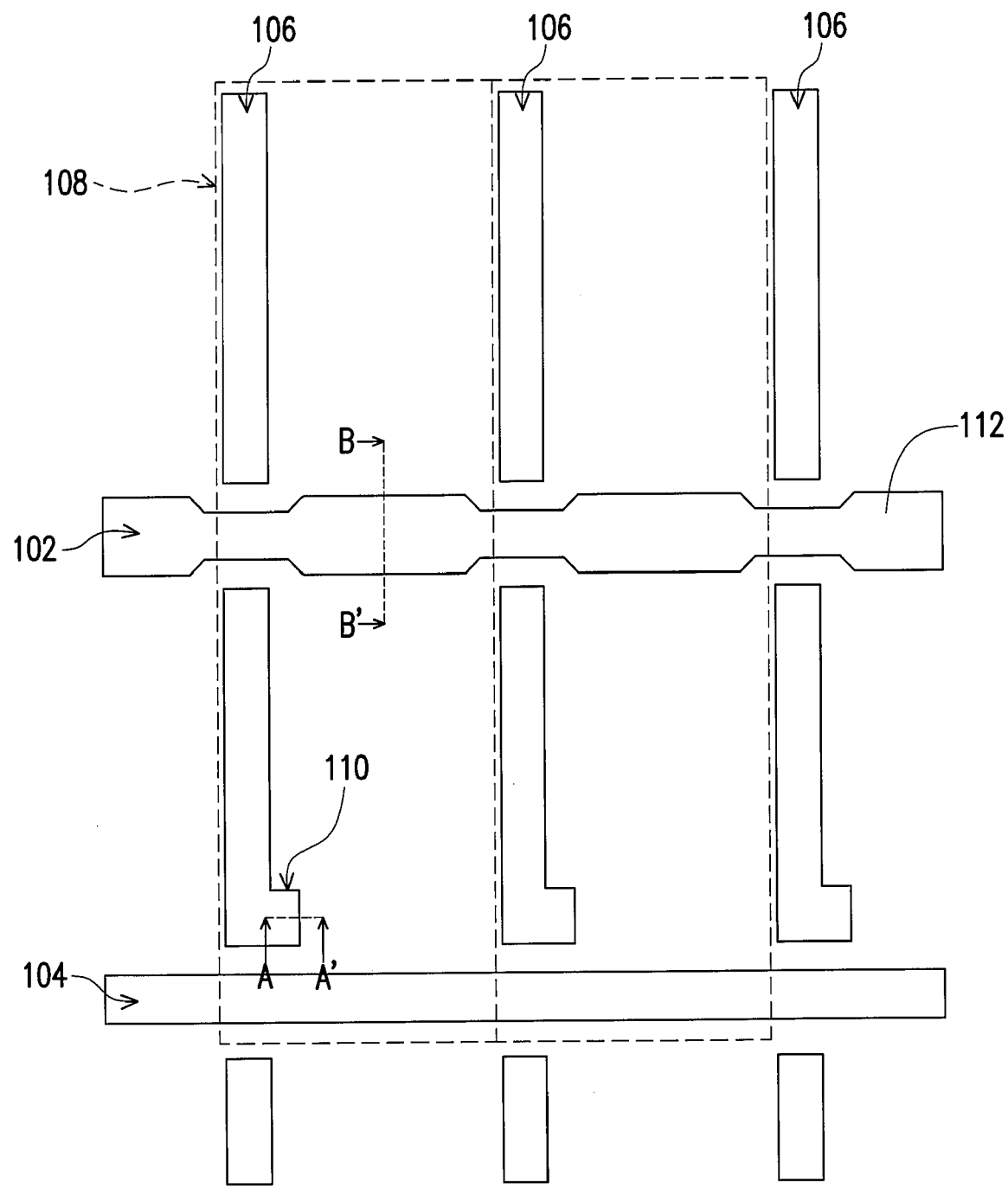
FIGS. 3A through 3E are cross-sectional views illustrating a fabricating process of a TFT array substrate according to an embodiment of the present invention.
Figure 4A:
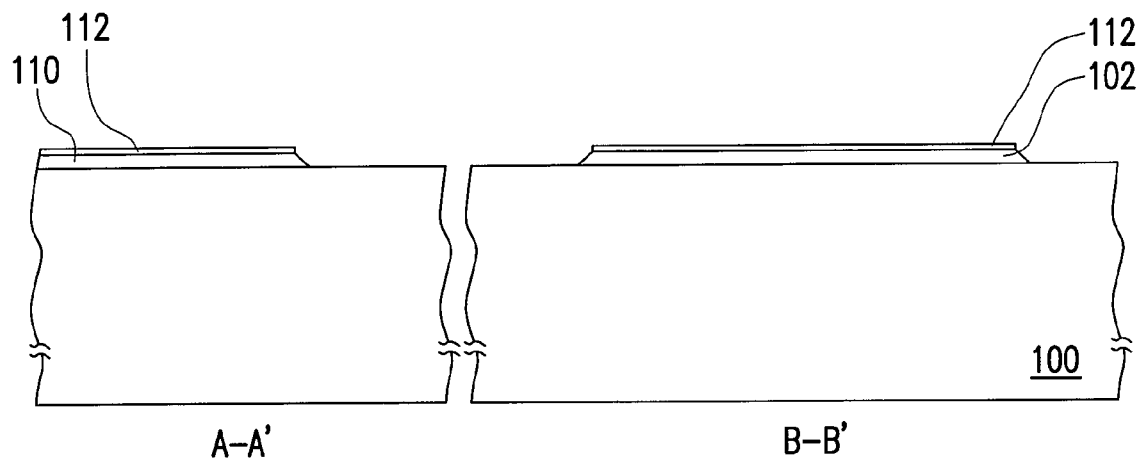
FIGS. 4A through 4E are cross-sectional views along lines A-A' and B-B' of FIGS. 3A through 3E illustrating the fabricating process flow of FIGS. 3A through 3E.

Firstly, referring to FIGS. 3A and 4A, a substrate 100 is provided. The substrate 100 for example is a transparent substrate such as a glass substrate. Then, a patterned first metallic layer (not shown) is formed on the substrate, to form a plurality of common lines 102 (only one common line 102 is shown in FIG. 3A for reference), a plurality of scan lines 104 (only one scan line 104 is shown in FIG. 3A for reference), and a plurality of source patterns 106. Each two adjacent scan lines 104 are orthogonal to two corresponding source patterns 106 adjacent to each other, so as to define a pixel area 108 on the substrate 100. The common lines 102 are configured passing through corresponding pixel areas 108 and parallel with the scan lines 104. A protrusion is extruded from each of the source patterns 106 at a position adjacent to its corresponding scan line 104, the protrusion acting as a source electrode 110. The first metallic layer for example is made by stacking a plurality of metallic layers, in order to avoid the first metallic layer form peeling from other layers adjacent thereto. The first metallic layer for example has a thickness ranged between 0.15 µm to 0.5 µm. However, the thickness of the first metallic layer is not subject to limit the present invention, in that one skilled in the art could make adjustment according to practical requirement.

Further, according to the embodiment, after the first metallic layer is formed and before patterning the first metallic layer, an ohmic contact layer 112 can be selectively formed. The ohmic contact layer 112 is thus patterned with the first metallic layer. Therefore, the ohmic contact layer 112 covers the common lines 102, the scan lines 104, and the source patterns 106. According to the embodiment, the ohmic contact layer 112 for example is made of doped amorphous silicon. A method of forming the ohmic contact layer 112 for example is depositing amorphous silicon by a chemical vapor deposition (CVD) process and simultaneously implanting ions therein. The type of ion implantation for example is an N-type heavy doping.

Figure 3B:
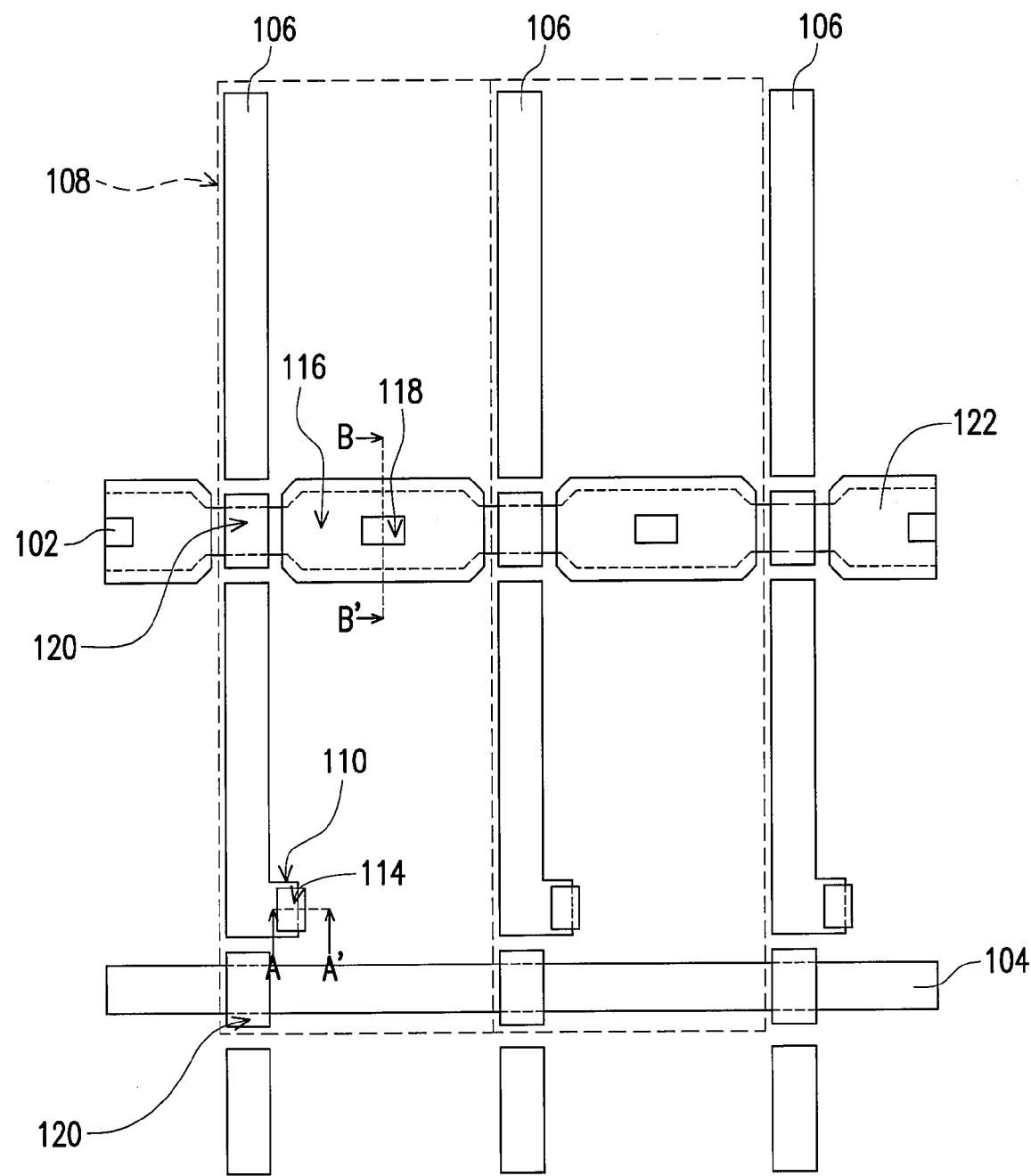
Figure 4B:
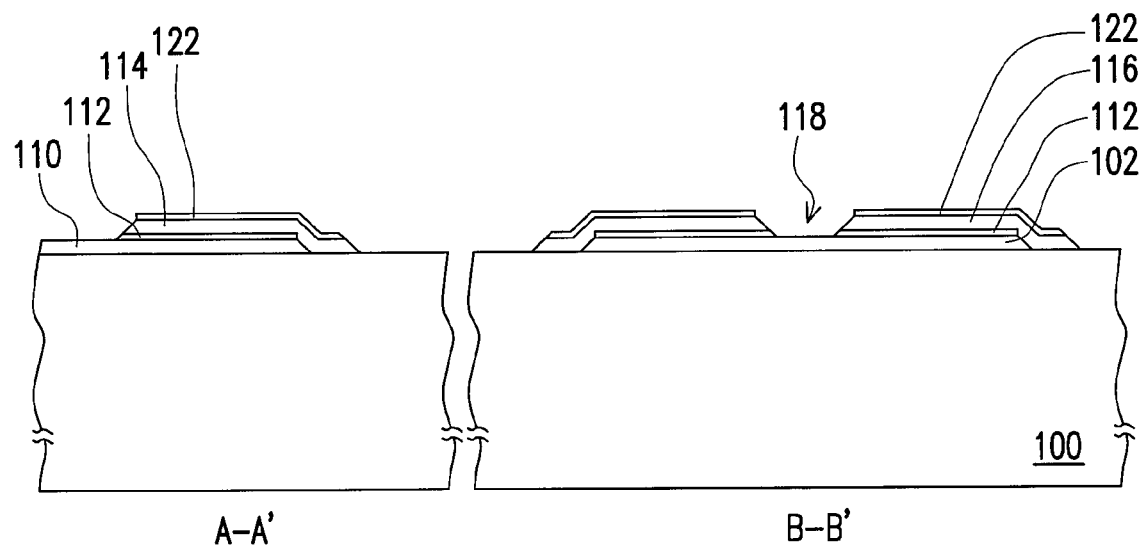

Then, referring to FIGS. 3B and 4B, a patterned semiconductor layer is formed over the substrate 100, to form a first semiconductor pattern 114 on the source electrode 110 in each pixel area 108, and a second semiconductor pattern 116 on the common line 102 in each pixel area 108. Each second semiconductor pattern 116 has a first opening 118 exposing the corresponding common line 102. The semiconductor layer for example has a thickness ranged between 0.2 µm to 2 µm. However, the thickness of the semiconductor layer is not subject to limit the present invention, in that one skilled in the art could make adjustment according to practical requirement.

A third semiconductor pattern 120 can be defined at an intersection of an extending direction of each source pattern 106 with the corresponding scan line 104 and the corresponding common line 102, during the formation of the semiconductor layer respectively.

Further, according to the embodiment, after the semiconductor layer is formed and before patterning the semiconductor layer, an ohmic contact layer 122 can be selectively formed on the semiconductor layer. The ohmic contact layers 112 and 122 can be simultaneously patterned with the semiconductor layer. According to the embodiment, the ohmic contact layer 122 for example is made of doped amorphous silicon. A method of forming the ohmic contact layer 112 for example is depositing amorphous silicon by a chemical vapor deposition process and simultaneously implanting ions therein. The type of ion implantation for example is an N-type heavy doping.

Figure 3C:
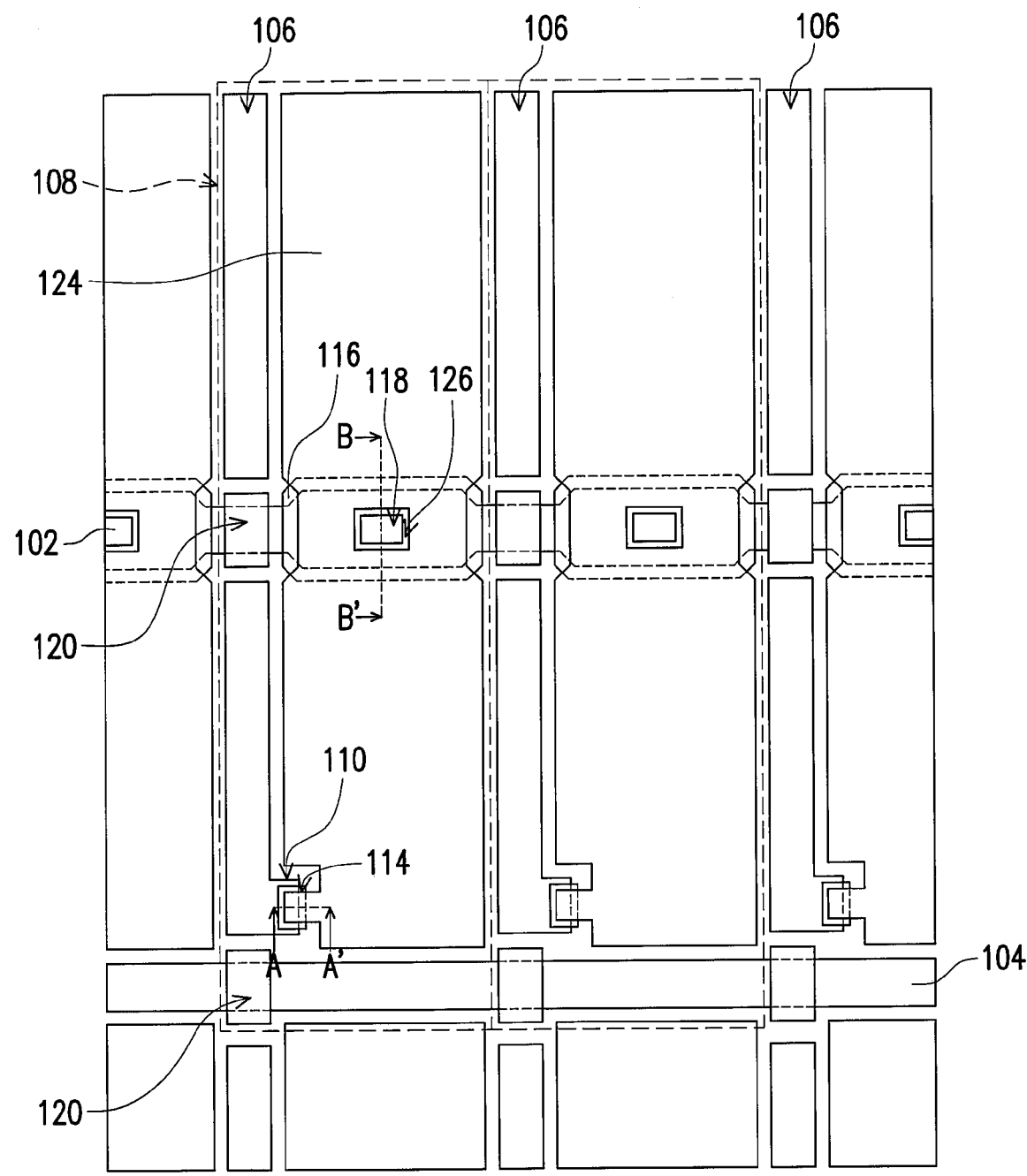
Figure 4C:
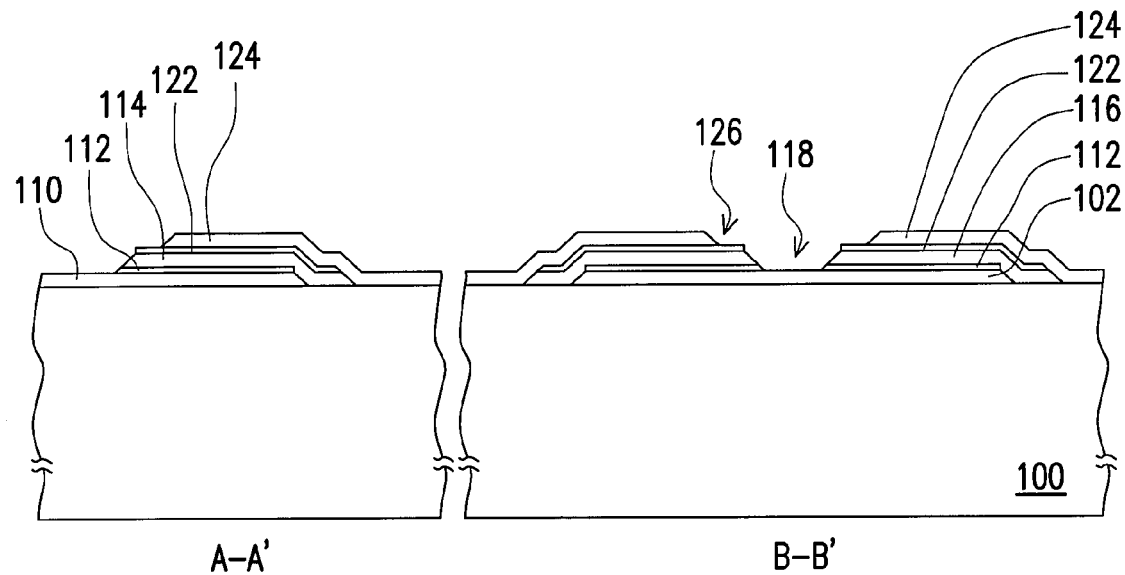

Then referring to FIGS. 3C and 4C, a patterned transparent conductive layer is formed over the substrate 100, to form a pixel electrode 124 in each pixel area 108. Each pixel electrode 124 covers a first semiconductor pattern 114 and a second semiconductor patter 116 corresponding thereto. Each pixel electrode 124 has a second opening 126 corresponding to the first opening 118. According to the embodiment, the transparent conductive layer, for example, is made of a material including indium tin oxide (ITO) or indium zinc oxide (IZO) by an evaporation process or a sputtering process. The transparent conductive layer for example has a thickness ranged between 0.1 µm to 0.5 µm. However, the thickness of the transparent conductive layer is not subject to limit the present invention, in that one skilled in the art could make adjustment according to practical requirement. The transparent conductor layer is directly disposed on the semiconductor layer, acting as a drain electrode and constituting a capacitor over the common line 102 for providing a storage capacitance.

Figure 3D:
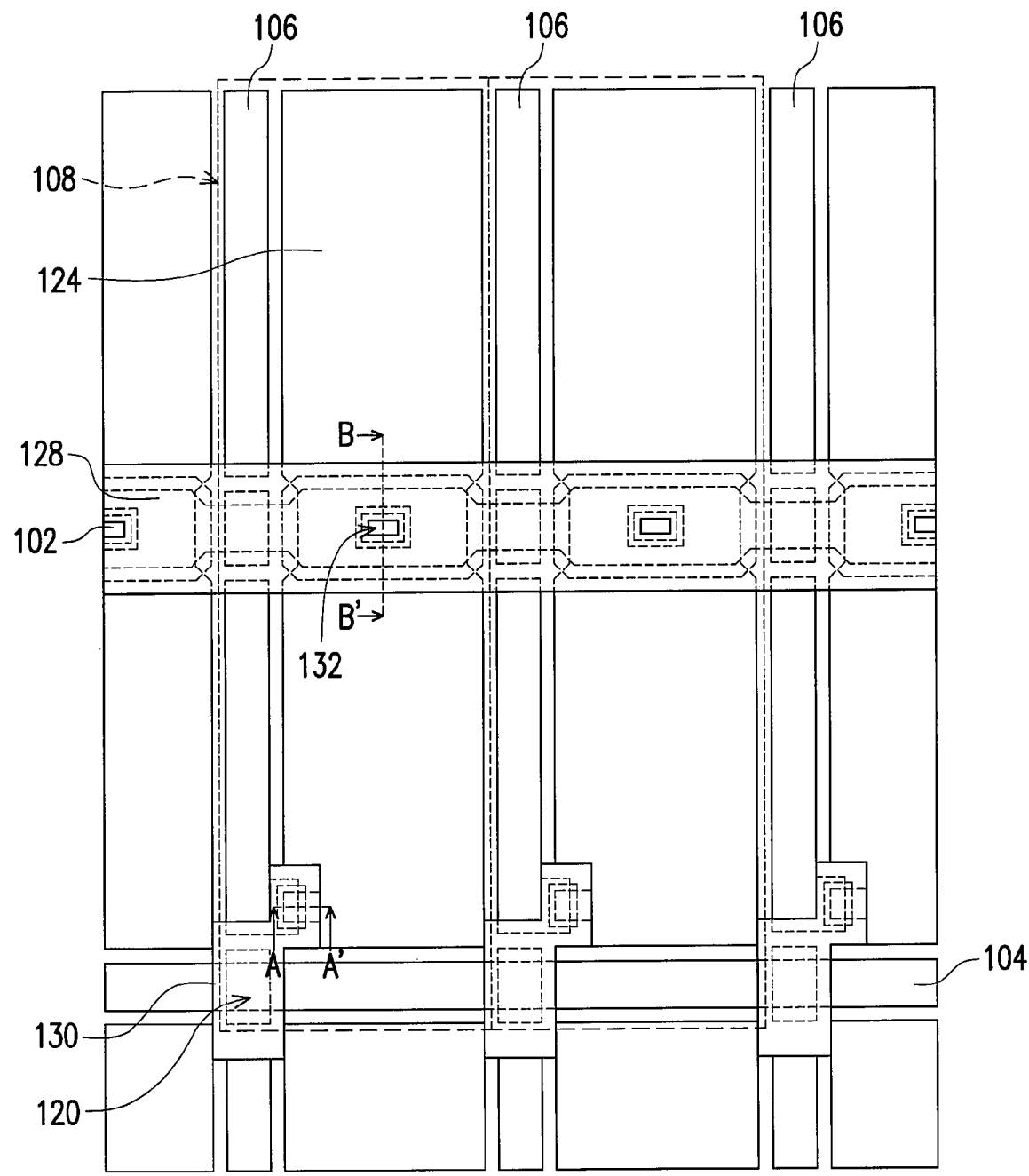
Figure 4D:
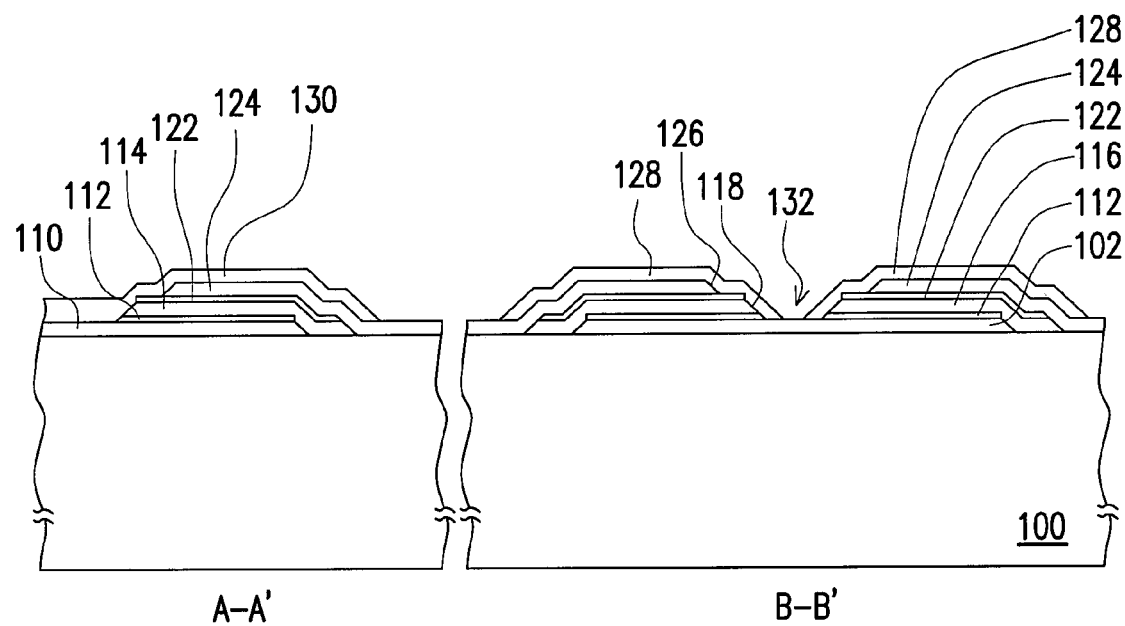

Then, referring to FIGS. 3D and 4D, a patterned dielectric layer is formed over the substrate 100, to form a first dielectric pattern 128 over each common line 102, and a second dielectric pattern 130 at the intersection of the extending direction of each source pattern 106 and the corresponding scan line 104. Each first dielectric pattern 128 has a third opening 132 corresponding to the second opening 126. Each second dielectric pattern 130 extends and covers the corresponding source electrode 110 and the first semiconductor pattern 114 configured over the source electrode 110, the pixel electrode 124, and the corresponding third semiconductor pattern 120. The dielectric layer for example is made of silicon oxide or nitride oxide, or other dielectric materials, by for example a CVD process. The dielectric layer for example has a thickness ranged between 0.3 µm to 0.6 µm. However, the thickness of the dielectric layer is not subject to limit the present invention, in that one skilled in the art could make adjustment according to practical requirement.

Figure 3E:
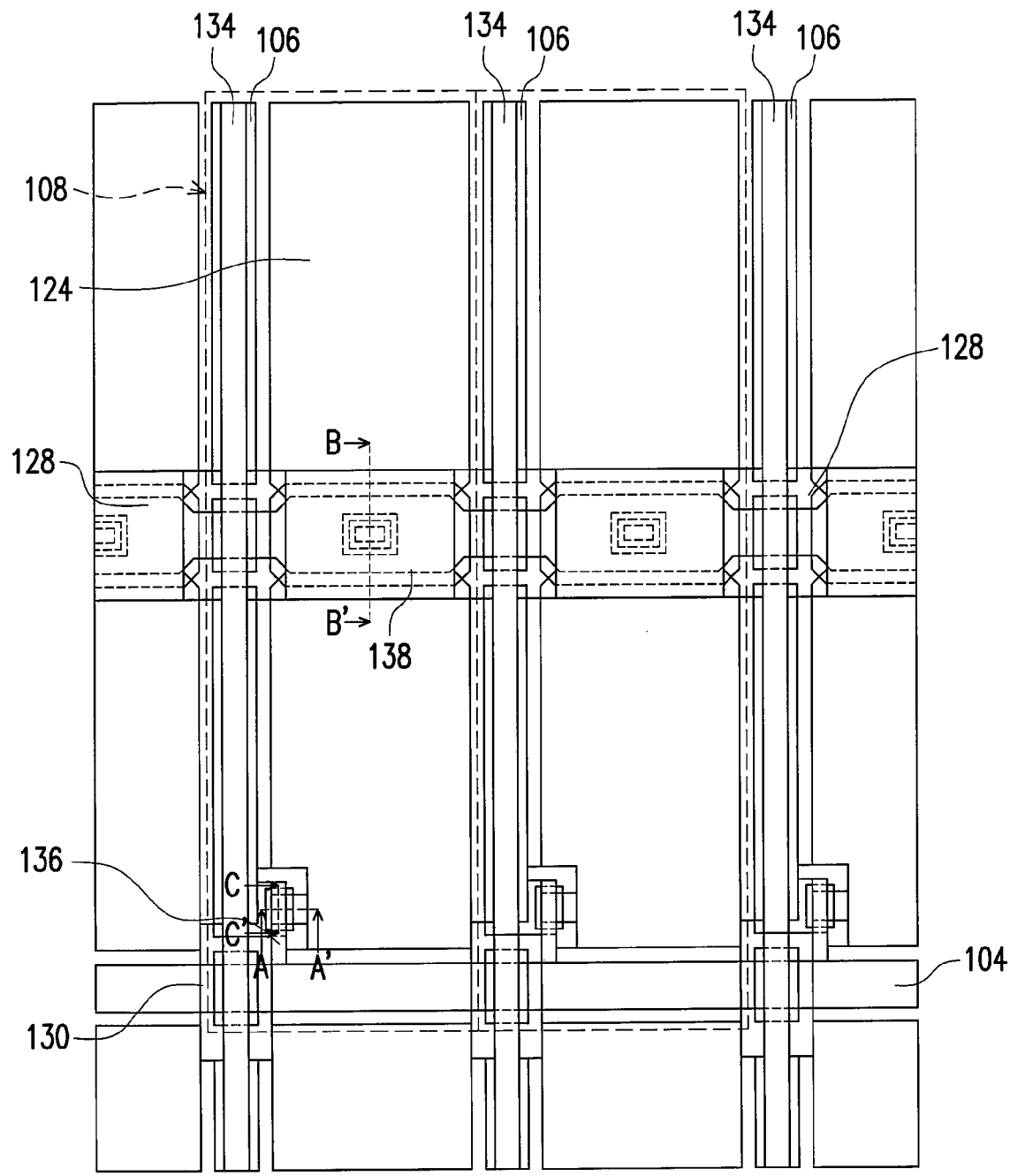
Figure 4E:
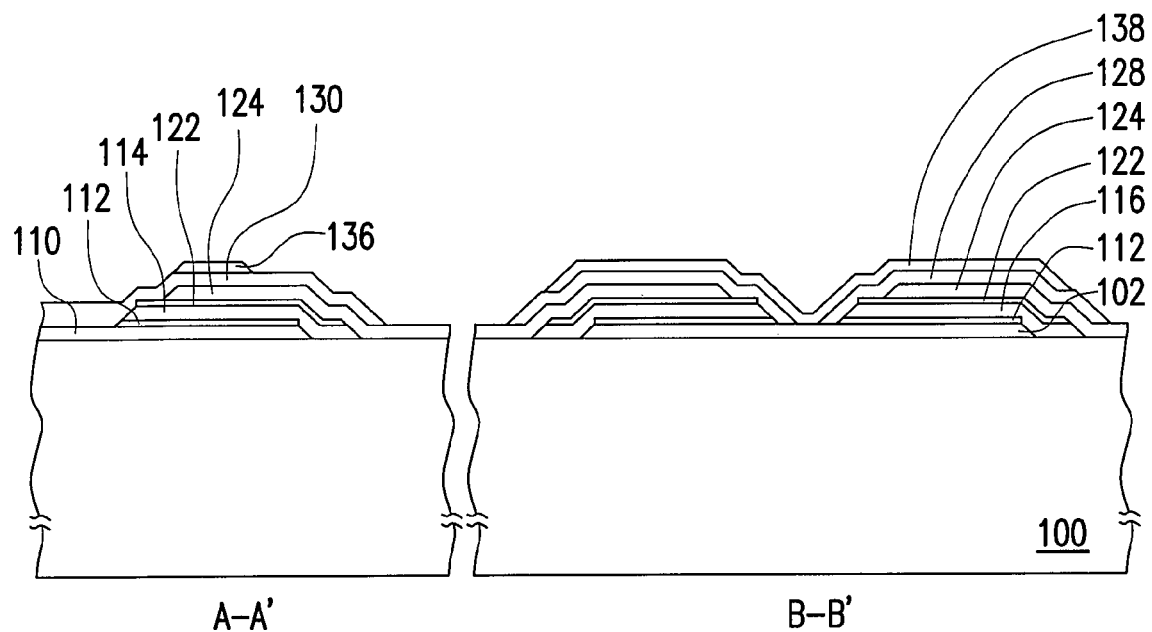

Then, referring to FIGS. 3E and 4E, a second metallic layer is formed over the substrate 100, to form a plurality of data lines 134, a plurality of gate electrodes 136, and a plurality of metal electrode 138. Each data line 134 is disposed on the corresponding source pattern 106 along the extending direction of the source pattern 106. Each gate electrode 136 is disposed on the second dielectric pattern 130 over the corresponding source electrode 110, extending to the scan line 104. Each metal electrode 138 is disposed over the first dielectric pattern 128 in the corresponding pixel area 108, and is electrically connected to the corresponding common line 102 via the corresponding third opening 132, the corresponding second opening 126, and the corresponding first opening 118. The metal electrode 138 and the common line 102 enclose or sandwich the pixel electrode 124, thus configuring a relatively large storage capacitor. The second metal layer for example has a thickness ranged between 0.15 µm to 0.5 µm. However, the thickness of the second metal layer is not subject to limit the present invention, in that one skilled in the art could make adjustment according to practical requirement.

Figure 5:
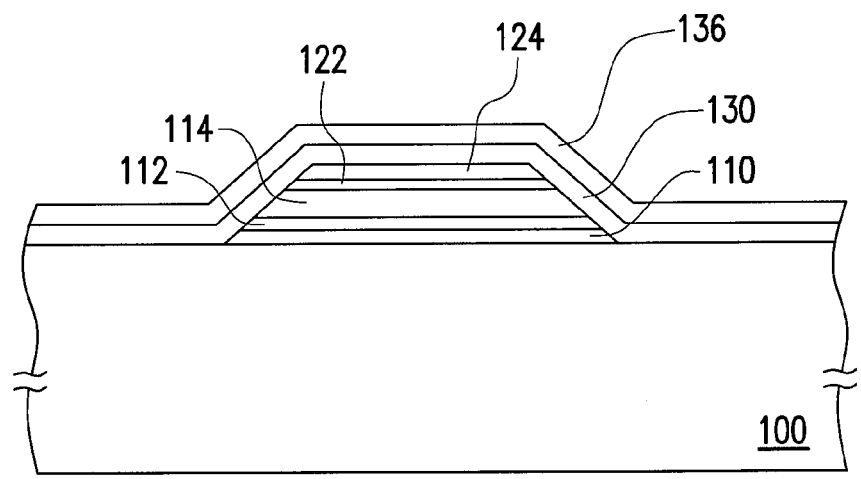
FIG. 5 is a cross-sectional view along line C-C' of FIG. 3E.

FIG. 5 is a cross-sectional view along line C-C' of FIG. 3E. Referring to FIG. 5, the source electrode 110 and a part of pixel electrode 124 taken as a drain electrode are positioned at a top side and a bottom side of the first semiconductor pattern 114, respectively, and constitute a vertical type TFT, in facilitating with the gate electrode 136 positioned on the second dielectric pattern 130. Such a vertical TFT according to the present invention is featured by double sides conducting which enhances channel width, and is capable of controlling channel length by selecting suitable film thicknesses. As such, a width/length ratio of the channel of the TFT can be promoted, thus the TFT is operable with a high conducting current. Furthermore, there also formed the ohmic contact layers 112 and 122 between the first semiconductor pattern 114, and respectively the source electrode 110 and the pixel electrode 124. The ohmic contact layers 112 and 122 are adapted for largely lowering an electron tunneling probability and lowering potential energy. In such a way, the electrical field therein is restrained and a short channel effect can be avoided.

In the TFT array substrate of above-illustrated embodiments, elements of each TFT thereof are vertically arranged, that is helpful for obtaining a higher conducting current. Furthermore, the common line 102 and the metal electrode 138 enclosing the pixel electrode 124, can also increasing the storage capacitance.

Figure 6A:
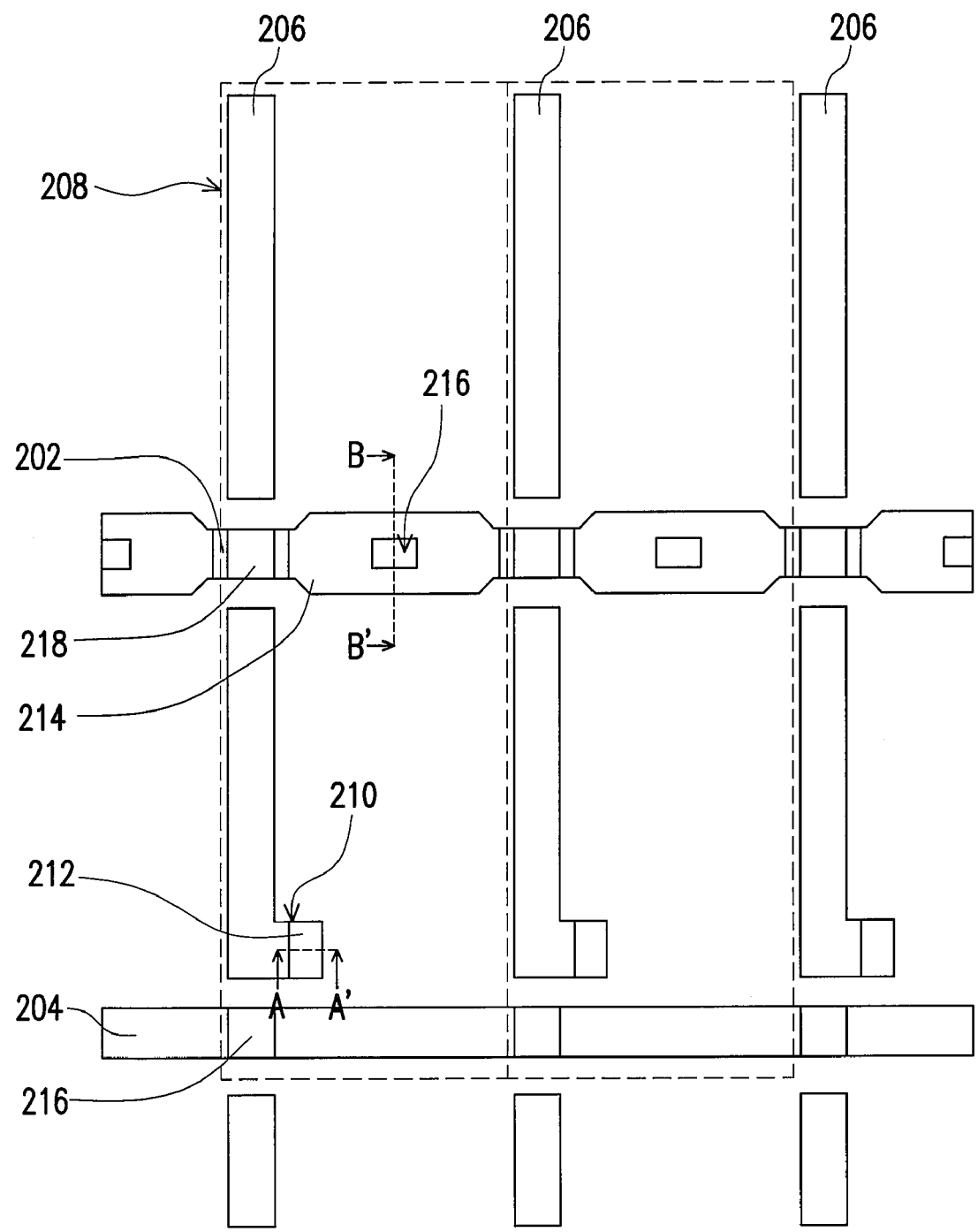
FIGS. 6A through 6C are cross-sectional views illustrating a fabricating process of a TFT array substrate according to another embodiment of the present invention.
Figure 6B:
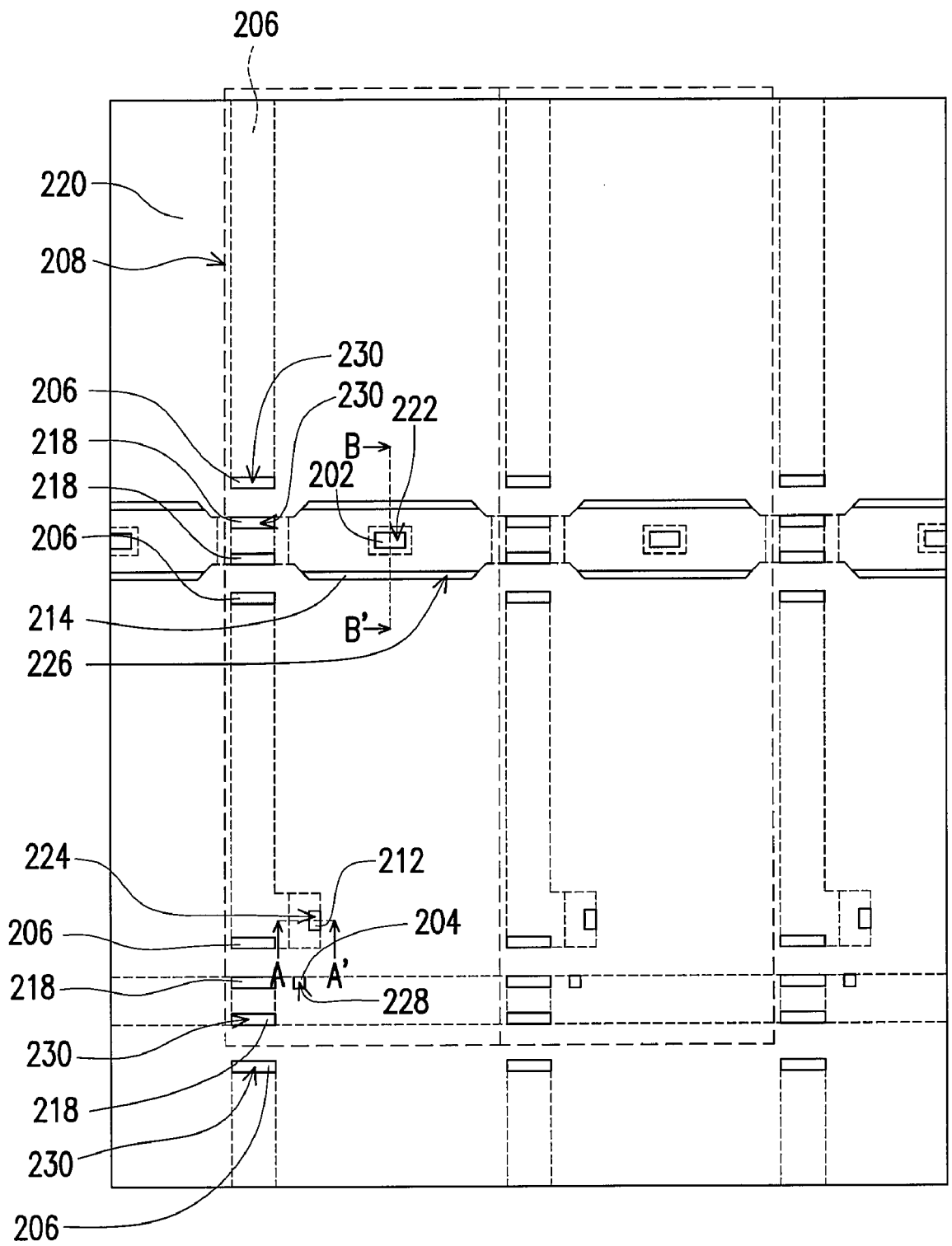
Figure 6C:
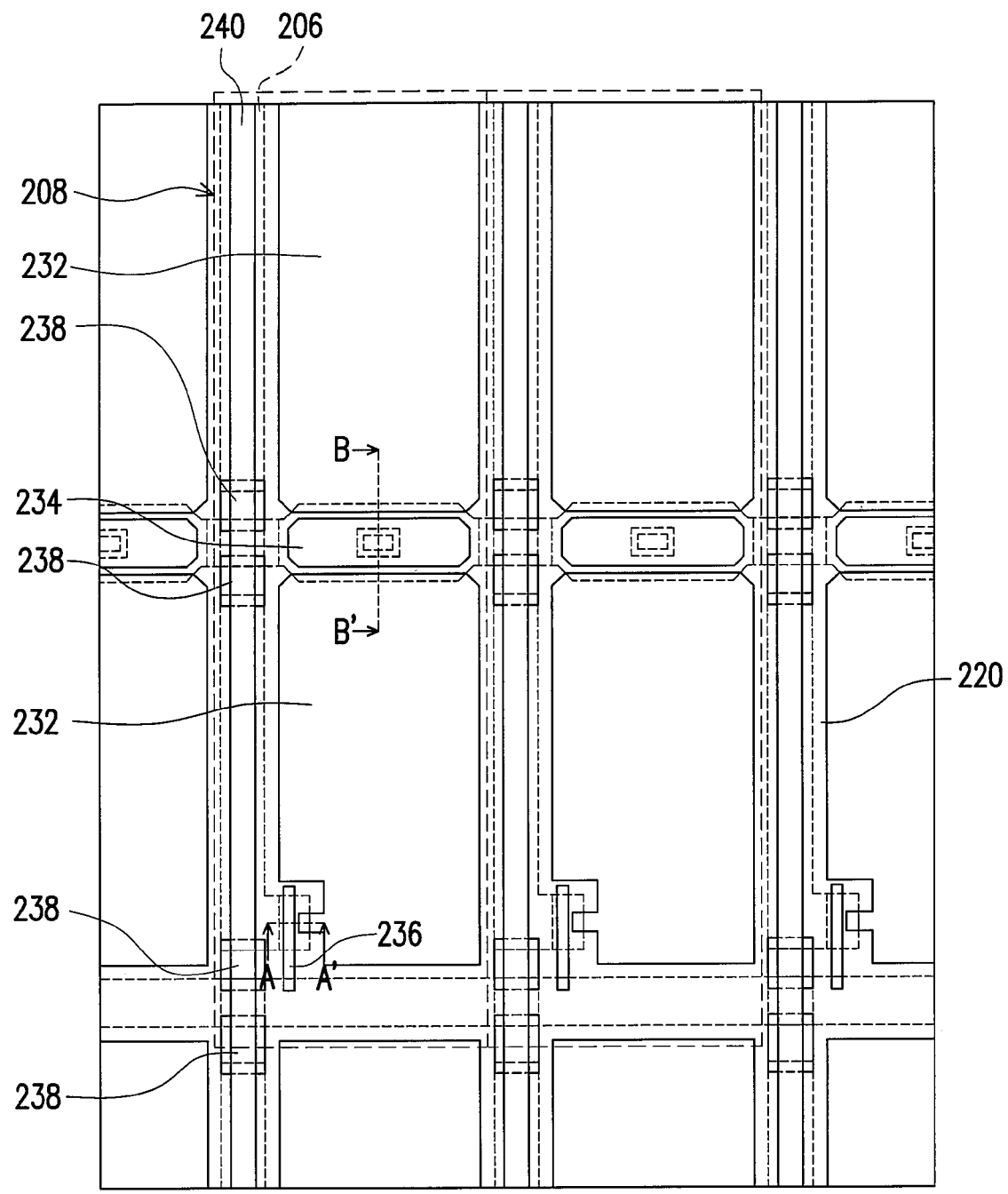
Figure 7A:
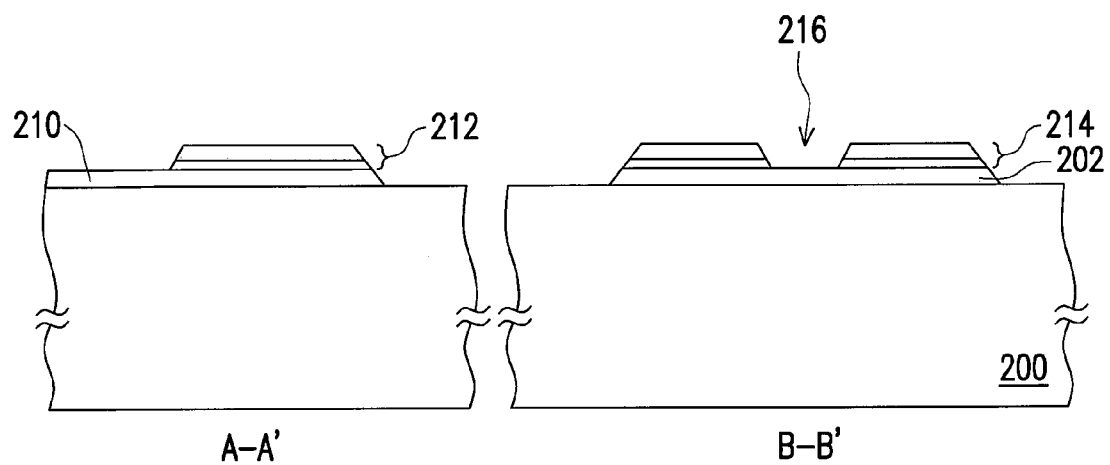
FIGS. 7A through 7C are cross-sectional views along lines A-A', and B-B' of FIGS. 6A through 6C illustrating the fabricating process flow of FIGS. 6A through 6C.
Figure 7B:
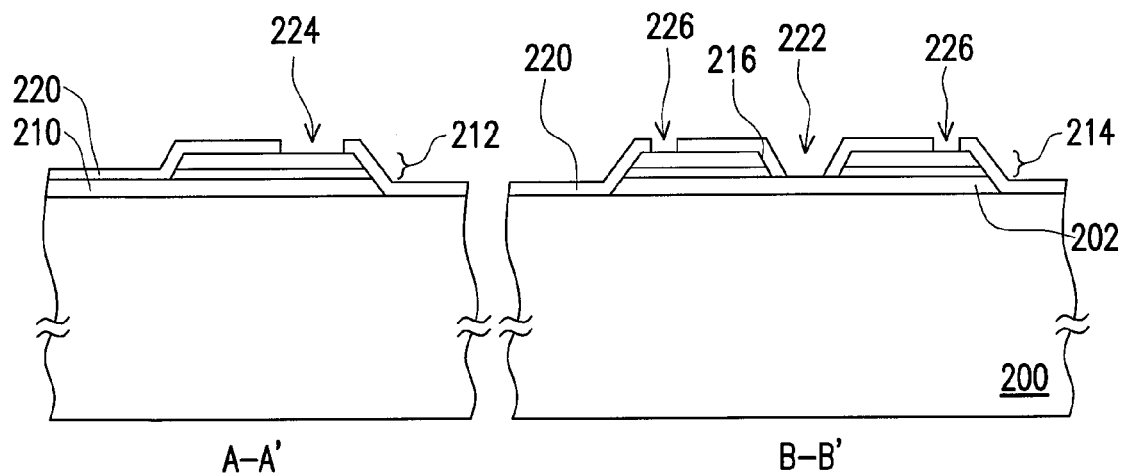
Figure 7C:
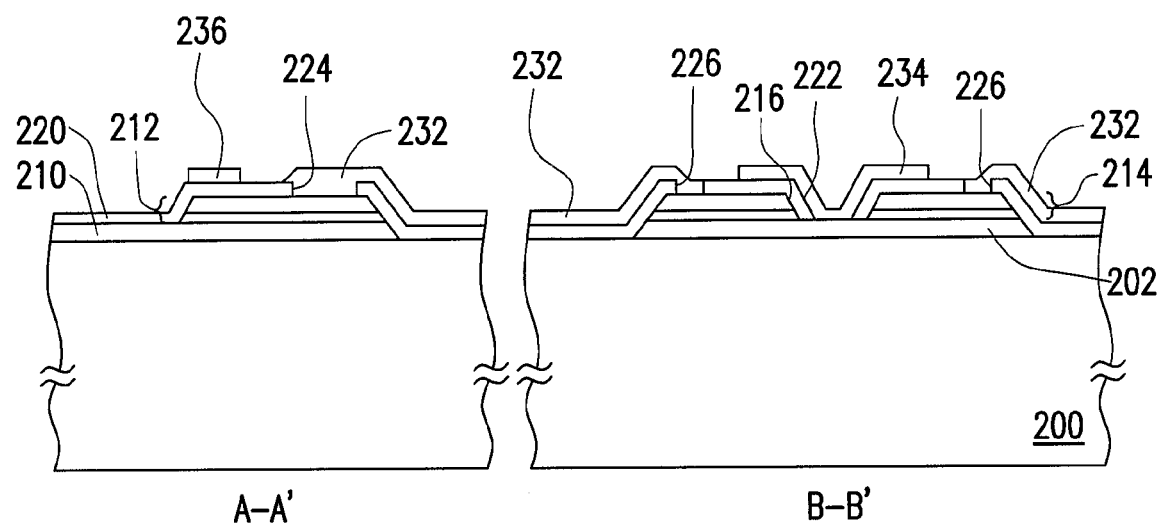

FIGS. 6A through 6C are cross-sectional views illustrating a fabricating process of a TFT array substrate according to another embodiment of the present invention. FIGS. 7A through 7C are cross-sectional views along lines A-A', and B-B' of FIGS. 6A through 6C illustrating the fabricating process flow of FIGS. 6A through 6C.

Referring to FIGS. 6A and 7A, a substrate 200 is provided. The substrate 200 for example is a transparent substrate, such as a glass substrate. Then a first metallic layer, a semiconductor layer, and a second metallic layer are formed over the substrate 200. In forming the semiconductor layer, ohmic contact layers can be simultaneously formed on a top side and a bottom side of the semiconductor layer. According to the embodiment, the ohmic contact layer for example is made of a doped amorphous silicon. A method of forming the ohmic contact layer for example is depositing amorphous silicon by a CVD process and simultaneously implanting ions therein. The type of ion implantation for example is an N-type heavy doping.

Then, the second metallic layer, the semiconductor layer, and the metallic layer are patterned. Therefore, the first metallic layer is defined as a plurality of common lines 202 (only one common line 202 is shown in FIG. 6A for reference), a plurality of scan lines 204 (only one scan line 204 is shown in FIG. 6A for reference), and a plurality of source patterns 206. Each two adjacent scan lines 204 are orthogonal to the two corresponding source patterns 206 adjacent to each other, so as to define a pixel area 208 on the substrate 200. The common lines 202 are configured passing through the corresponding pixel areas 208 and parallel with the scan lines 204. A protrusion is extruded from each of the source patterns 206 at a position adjacent to its corresponding scan line 204, the protrusion acting as a source electrode 210. The first metallic layer for example is made by stacking a plurality of metallic layers, in order to avoid the first metallic layer form peeling from other layers adjacent thereto.

At the same time, the second metallic layer and the semiconductor layer in each pixel area 208 are defined as a first pattern stack 212 positioned over a corresponding source electrode 210, and a second pattern stack 214 positioned over a corresponding common line 202, and a third pattern stack 218 positioned over an intersection of an extending direction of each source pattern 206 with the corresponding scan line 204 and the corresponding common line 202. Each second pattern stack 214 has a first opening 216 exposing the corresponding common line 202. The second metallic layer of the first pattern stack 212 acts as a drain electrode of the TFT according to the embodiment of the present invention.

Then, referring to FIGS. 6B and 7B, a patterned dielectric layer 220 is formed over the substrate 200, to form a second opening 222 over and corresponding to the first opening 216 in each pixel area 208, a third opening 224 over the first pattern stack 212 and exposing a part of the first pattern stack 212 in each pixel area 208, a plurality of fourth openings 226 over the second pattern stack 214 and exposing a part of the second pattern stack 214 in each pixel area 208, a fifth opening 228 over a side of the scan line 204 adjacent to the source electrode 210 and exposing a part of the scan line 204 in each pixel area 208, and a plurality of sixth opening 230 over both sides of the source pattern 206 and both sides of the third pattern stack 218 and exposing a part of the source pattern 206 and a part of the third pattern stack 218 in each pixel area 208. The dielectric layer for example is made of silicon oxide or nitride oxide, or other dielectric materials, by for example a CVD process.

Then, referring to FIGS. 6C and 7C, a patterned transparent conductive layer is formed over the substrate 100, to form two pixel electrodes 232 at both sides of the common line 202 in each pixel area 208. The pixel electrodes 232 are electrically connected to the second pattern stack 214 via the fourth openings 226. One of the two pixel electrodes 232 is electrically connected to the corresponding first pattern stack 212 via the corresponding third opening 224. A first transparent electrode 234 is defined over the second pattern stack 214 in each pixel area 208. The first transparent electrode 234 is electrically connected to the corresponding common line 202 via the corresponding second opening 222 and the corresponding first opening 216. A gate electrode 236 is formed over the source electrode 210 in each pixel area 208. The gate electrode 236 is electrically connected to the corresponding scan line 204 via the corresponding fifth opening 228. A second transparent electrode 238 is defined at the intersection of the extending direction of each source pattern 216 with the corresponding common line 202 and the corresponding scan line 204. The second transparent electrode 238 is electrically connected to the corresponding source electrode 206 and the corresponding third pattern stack 218 via the corresponding sixth opening 230. The first transparent electrode 234 and the common line 102 enclose or sandwich the second metallic layer of the second pattern stack 214 for obtaining a larger storage capacitance. According to the embodiment, the transparent conductive layer, for example, is made of a material including indium tin oxide (ITO) or indium zinc oxide (IZO) by an evaporation process or a sputtering process.

Then a patterned third metallic layer is formed over the substrate 200, to form a plurality of data lines 240. Each data line 240 is disposed over the corresponding source pattern 206, along the extending direction of the corresponding source pattern 206, and is electrically connected to the corresponding second transparent electrode 238.

The TFT array substrate according to the present invention includes vertical type TFTs, so that the TFT array substrate has relatively small fabrication area and is operable with a high conducting current. Further, the first transparent electrode 234 and the common line 102 enclose or sandwich the second metallic layer of the second pattern stack 214, so as to enhance the storage capacitance.

In summary, the present invention as least have the following advantages:

1. Elements of the TFT array substrate according to the present invention are arranged vertically, so that the TFT array substrate has relatively small fabrication area and is operable with a high conducting current;
2. The storage capacitance can be enhanced by enclosing or sandwiching the transparent electrodes with the common lines and the second metallic layer, or alternatively by enclosing or sandwiching the second metallic layer with the common lines and the transparent electrodes. In such a way, pixel flashing caused by those coupled signals can be reduced, thus promoting displaying quality thereof.
3. Ohmic contact layers are configured at both of the top side and the bottom side of the semiconductor layer, and thus short channel effect can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A TFT array substrate, comprising:
   a substrate;
   a patterned first metallic layer disposed on the substrate, the patterned first metallic layer comprising a plurality of common lines, a plurality of scan lines, and a plurality of source patterns, wherein each two adjacent scan lines are orthogonal to two corresponding source patterns adjacent to each other so as to define a pixel area on the substrate, the common lines are configured passing through their corresponding pixel areas, and parallel with the scan lines, and a protrusion is extruded from each of the source patterns at a position adjacent to its corresponding scan line, acting as a source electrode;

a patterned semiconductor layer disposed on the patterned first metallic layer and the substrate, comprising a plurality of first semiconductor patterns and a plurality of second semiconductor patterns, wherein the first semiconductor patterns are correspondingly configured on the source electrodes in the pixel areas, and the second semiconductor patterns are correspondingly configured on the common lines in the pixel areas, respectively, and each second semiconductor pattern has a first opening exposing the common line;

a patterned transparent conductive layer disposed on the patterned semiconductor layer and the substrate, defining a pixel electrode in each pixel area, wherein each pixel electrode covers a first semiconductor pattern and a second semiconductor pattern corresponding thereto, and each pixel electrode has a second opening corresponding to the first opening;

a patterned dielectric layer disposed over the substrate, comprising a plurality of first dielectric patterns, and a plurality of second dielectric patterns, wherein each first dielectric pattern is disposed over the corresponding common line, and has a third opening corresponding to the second opening, and each second dielectric pattern is disposed at an intersection of an extending direction of each source pattern and its corresponding scan line and extends to cover its corresponding source electrode, and the first semiconductor pattern and the pixel electrode formed over the source electrode; and a patterned second metallic layer, disposed over the substrate, comprising a plurality of data lines, a plurality of gate electrodes, and a plurality of metallic electrodes, wherein each data line is disposed on the corresponding source pattern along the direction the source pattern extending, each gate electrode is disposed on the second dielectric pattern over the corresponding source electrode, extending to connect to the corresponding scan line, and each metal electrode is disposed on the first dielectric pattern in the corresponding pixel area, electrically connected to its corresponding common line via the third opening, the second opening and the first opening.

2. The TFT array substrate of claim 1, further comprising ohmic contact layers respectively disposed at a top side and a bottom side of the semiconductor layer.

3. The TFT array substrate of claim 2, wherein the material of the ohmic contact layers comprises doped amorphous silicon.

4. The TFT array substrate of claim 1, wherein the transparent conductive layer is made of a material including indium tin oxide (ITO) or indium zinc oxide (IZO).

5. The TFT array substrate of claim 1, wherein the first metallic layer is formed by stacking a plurality of metallic layers.

6. The TFT array substrate of claim 1, wherein the patterned semiconductor layer further comprises a plurality of third semiconductor patterns, disposed at the intersection of the extending direction of each source pattern with the corresponding scan line and the corresponding common line, each third semiconductor pattern being covered by the corresponding second dielectric pattern.

* * * * *